United States Patent [19]

Hagita

[11] Patent Number: 5,107,135
[45] Date of Patent: Apr. 21, 1992

[54] SINUSOIDAL-TO-SQUAREWAVE CONVERTER WITH VARIABLE THERESHOLD LEVEL

[75] Inventor: Hiroyuki Hagita, Hachioji, Japan

[73] Assignee: Olympus Optical Co., Ltd., Tokyo, Japan

[21] Appl. No.: 611,739

[22] Filed: Nov. 13, 1990

[30] Foreign Application Priority Data

Nov. 16, 1989 [JP] Japan .................. 1-296159

[51] Int. Cl.⁵ .................. H03K 5/00; H03K 5/153
[52] U.S. Cl. .................. 307/261; 307/358; 328/164
[58] Field of Search .............. 307/261, 262, 358, 350, 307/351; 328/146, 164

[56] References Cited

U.S. PATENT DOCUMENTS

| | | | |
|---|---|---|---|
| 3,987,413 | 10/1976 | Wilmer | 307/351 X |
| 4,109,211 | 8/1978 | Mese et al. | 307/358 X |
| 4,219,152 | 8/1980 | Couch et al. | 307/351 X |
| 4,634,983 | 1/1987 | Schemmel et al. | 307/261 X |
| 4,975,657 | 12/1990 | Eastmond | 307/358 X |
| 5,003,196 | 3/1991 | Kawaguchi | 307/351 X |
| 5,005,427 | 4/1991 | Ohmae | 307/358 X |

FOREIGN PATENT DOCUMENTS

| | | |
|---|---|---|
| 61-34769 | 2/1986 | Japan . |
| 61-182675 | 8/1986 | Japan . |
| 62-12957 | 1/1987 | Japan . |

Primary Examiner—Stanley D. Miller
Assistant Examiner—Toan Tran
Attorney, Agent, or Firm—Stevens, Davis, Miller & Mosher

[57] ABSTRACT

A bivalent signal generating circuit in which an input signal having a substantial sinusoidal waveform can be converted to a bivalent signal without causing chattering: in this bivalent signal generating circuit, the bivalent signal is generated by comparing the input signal with a hysteresis width, and the circuit is arranged such that the hysteresis width is varied in accordance with a signal level of the input signal. Therefore, even if a noise is superimposed upon the input signal and thus the level of the input signal becomes large, it is possible to generate the bivalent signal in a correct and stable manner.

6 Claims, 8 Drawing Sheets

FIG_1
PRIOR ART

FIG_2
PRIOR ART

50 Comparator with Hysteresis

FIG_3A PRIOR ART

FIG_3B PRIOR ART

FIG_3C PRIOR ART

FIG_3D PRIOR ART

FIG_7

FIG_8

4 Maximum Value Detecting Circuit

FIG_9A Signal 101

FIG_9B Signal 102

FIG_9C Signal 111

FIG_9D Signal 101
Signal 105
Signal 106

FIG_9E Signal 107

FIG_9F Signal 108

FIG_9G Signal 109

FIG_10

FIG_11

5,107,135

SINUSOIDAL-TO-SQUAREWAVE CONVERTER WITH VARIABLE THERESHOLD LEVEL

BACKGROUND OF THE INVENTION

Field of the Invention and Prior Art Statement

The present invention relates to a bivalent signal generating circuit for converting an input signal having a substantially sinusoidal waveform into a bivalent signal having high and low levels. Particularly, the bivalent signal generating circuit according to the present invention is suitable for converting into a bivalent signal, a tracking error signal, which is obtained from an optical pick up device for reading out information recorded on an information recording medium such as an optical disc and an optical card.

Hitherto, in an information recording and/or reading out apparatus using the information recording medium such as the optical disc and the optical card, the optical pick up device is moved in a tracking direction, i.e. a direction across tracks formed on the information recording medium, in order to search information recorded thereon at a high speed. In this case, the tracking error signal is used for counting the number of tracks, across which the light beam has transversed, and for detecting a moving velocity of the light beam on the recording medium. That is to say, the tracking error signal is converted to the bivalent signal by comparing the tracking error signal with a given threshold level in a comparator, and then the numbers of the thus converted bivalent signals is counted to measure the numbers of the tracks over which the light spot has moved and the period of this bivalent signal is detected to measure the moving velocity.

However, the tracking error signal does not always have a correct sinusoidal waveform. If a condition of a surface of the optical information recording medium is not good or there is an interference between recording pits, a noise is sometimes superimposed upon the tracking error signal. Thus, when the tracking error signal, on which the noise has been superimposed, is converted to the bivalent signal with the aid of the comparator having the single threshold level, a chattering is caused in the vicinity of the given threshold level due to the noise. Accordingly, counting of the number of tracks and detecting of the moving velocity of the light beam cannot be carried out correctly.

In order to remove the above mentioned chattering there has been proposed a comparator having a hysteresis property.

Figure 1:
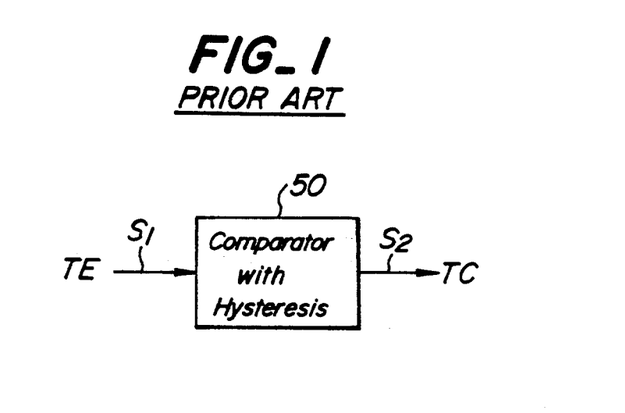
FIG. 1 is a block diagram showing a conventional bivalent circuit.
Figure 2:
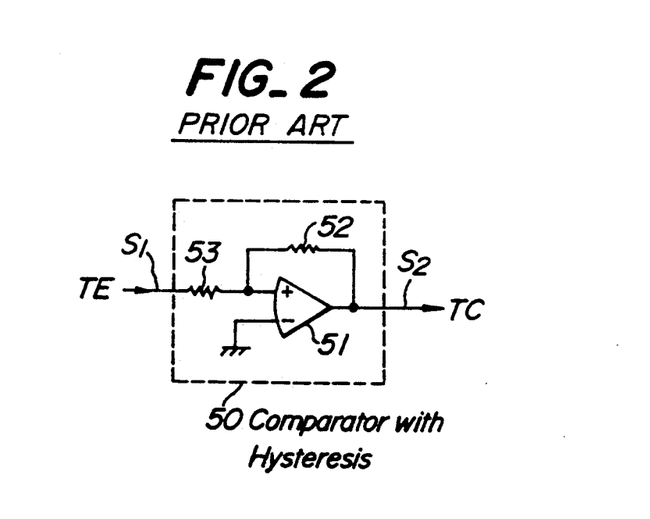
FIG. 2 is a circuit diagram depicting a structure of the conventional bivalent signal generating circuit shown in FIG. 1.

FIG. 1 is a block diagram showing such a bivalent signal generating circuit for use in converting the tracking error signal to the bivalent signal. As shown in FIG. 1, in the conventional bivalent signal generating circuit, a comparator circuit with hysteresis 50 is used as the comparator for producing the bivalent signal. FIG. 2 is a circuit diagram depicting the construction of one example of the comparator circuit with hysteresis 50. As depicted in FIG. 2, in the comparator circuit with hysteresis 50, the tracking error signal $S_1$ is supplied to a non-inverted input terminal of a comparator 51 via a resistor 53, while an inverted input terminal of the comparator 51 is connected to the ground. An output signal of the comparator 51 is connected to the non-inverted input thereof via a resistor 52 to form a positive feedback loop; and the hysteresis function is realized thereby.

Figure 3A:
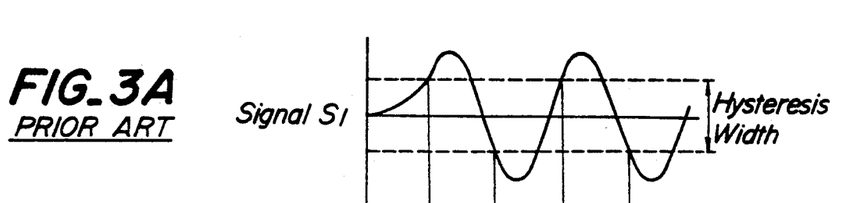
FIGS. 3A to 3D are waveforms of input and output signals which are supplied to and generated in the conventional bivalent signal generating circuit shown in FIGS. 1 and 2.
Figure 3B:
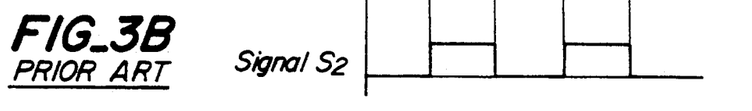
Figure 3C:
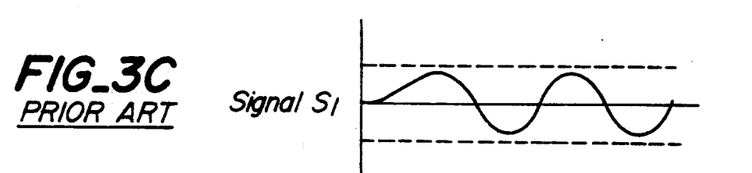
Figure 3D:
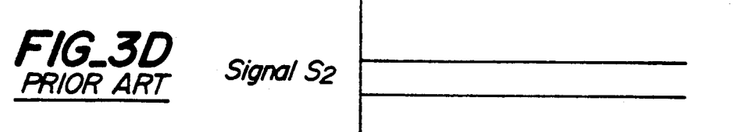

However, in the conventional bivalent signal generating circuit 50, a hysteresis width is usually set such that when a signal level of the tracking error signal is substantially constant, it is possible to effect a proper conversion. However, in practice, the signal level, i.e. a peak-to-peak value of the tracking error signal is varied over a wide range, so that the conversion could not be performed in a proper manner. That is to say, since the noise level has a tendency to vary in proportion with the signal level of the tracking error signal level, it is necessary to determine the hysteresis width large so as not to be influenced by the noise even when the signal level of the tracking error signal becomes maximum. While, in order to produce the bivalent signal even when the signal level of the tracking error signal becomes minimum, it is required to make the hysteresis width small. That is to say, in the known comparator, the threshold levels could not be varied in accordance with the peak-to-peak value of the tracking error signal. As shown in FIG. 3A, under the condition that the large hysteresis width is given as shown by broken lines, when the tracking error signal $S_1$ having a large signal level is supplied to the comparator circuit 50, the bivalent signal $S_2$ can be obtained in a proper manner because the tracking error signal $S_1$ varies beyond the threshold levels; but when the tracking error signal $S_1$ having its signal level smaller than the hysteresis width, as illustrated in FIG. 3C, the output signal $S_2$ of the comparator 51 is not changed and the bivalent signal could not be obtained correctly.

Particularly, in a magneto-optic disc, there are provided prepit regions in which address information of tracks of the disc is preliminarily recorded, so that a large noise is superimposed upon the tracking error signal at the prepit regions. Therefore, where a magneto-optis information recording medium is used, the problem mentioned above is apt to be caused.

SUMMARY OF THE INVENTION

The present invention has for its purpose to provide a bivalent signal generating circuit by which the tracking error signal can be converted to a bivalent signal in a correct and stable manner without being influenced by chattering even when a variation of the level of the tracking error signal is large and a comparatively large noise is superimposed on the tracking error signal.

In order to carry out the purpose, the bivalent signal generating circuit according to the present invention comprises:

hysteresis width controlling means for receiving an input signal having a substantially sinusoidal waveform to produce a hysteresis width controlling signal whose signal level is changed in accordance with a signal level of the input signal; and comparing means for setting a variable hysteresis width in accordance with said hysteresis width controlling signal and comparing the input signal with a threshold level determined by the hysteresis width to generate a bivalent signal corresponding to the input signal.

According to the present invention, when the input signal having a substantially sinusoidal waveform, for instance, a tracking error signal, is varied in its signal level or a noise is superimposed upon the input signal, it is possible to change a hysteresis width to a proper width in the comparing means. Therefore, in the bivalent signal generating circuit according to the invention, the input signal can be converted to the bivalent signal

DETAILED EXPLANATION OF THE PREFERRED EMBODIMENTS

Figure 4:
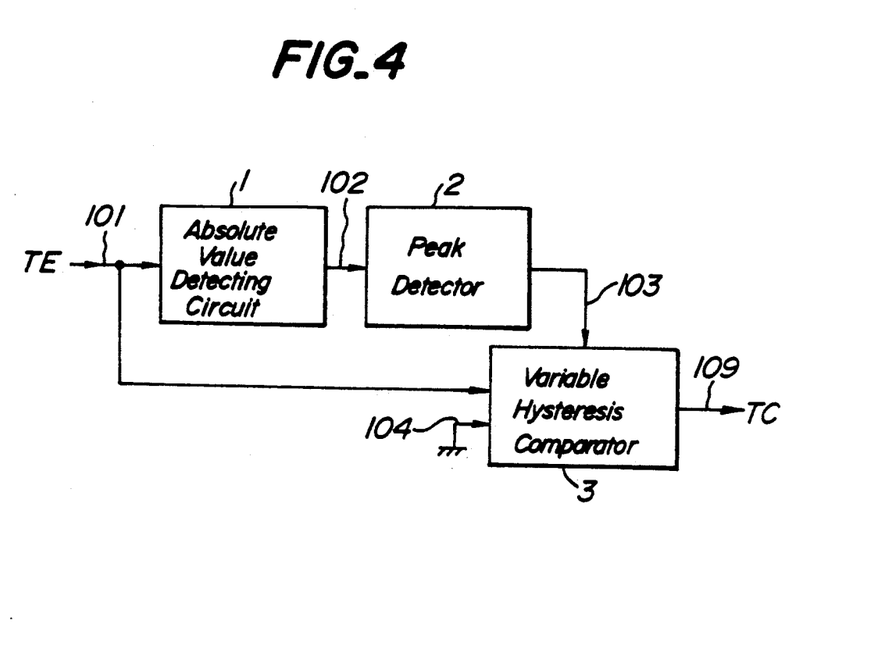
FIG. 4 is a block diagram illustrating a first embodiment of the bivalent signal generating circuit according to the invention.

FIG. 4 is a block diagram showing a structure of the first embodiment of the bivalent signal generating circuit according to the invention. This bivalent signal generating circuit comprises an absolute-value detecting circuit 1, a peak detector 2 and a variable hysteresis comparator 3. As is clear from FIG. 4, a tracking error signal 101 is firstly supplied to the absolute-value detecting circuit 1; an output signal 102 of the absolute-value detecting circuit 1 is supplied to the peak detector 2; and an output signal 103 of the peak detector 2 is supplied to the variable hysteresis comparator 3. To the variable hysteresis comparator 3, are further supplied said tracking error signal 101 and a signal having a standard level (ground signal) 104. According to the invention the variable hysteresis comparator 3 is constructed such that a hysteresis width thereof is varied in accordance with the output signal 103 of the peak detector 2; and the grounded signal 104 and the tracking error signal 101 is compared with the hysteresis width to produce the bivalent signal corresponding to the tracking error signal 101.

Figure 5:
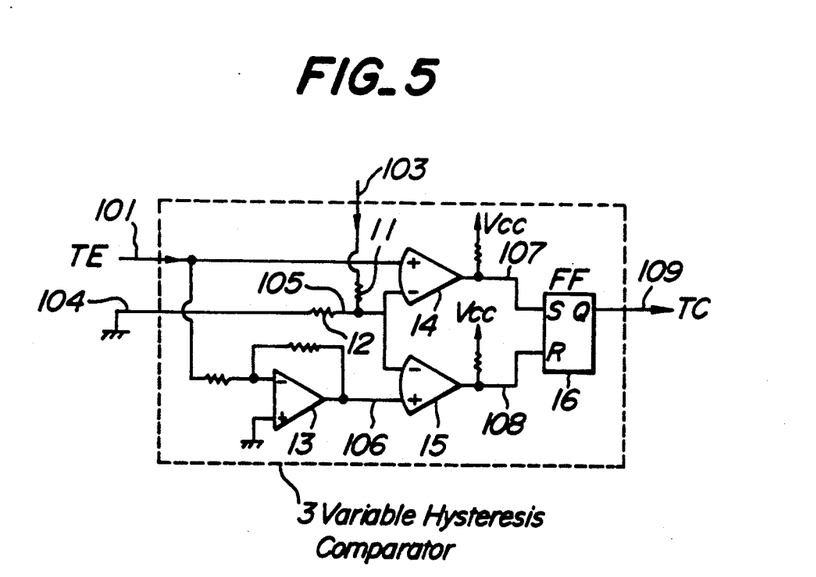
FIG. 5 is a circuit diagram representing a variable hysteresis comparator used in the first embodiment of the bivalent signal generating circuit illustrated in FIG. 4.

FIG. 5 is a circuit diagram depicting a structure of the variable hysteresis comparator 3. The comparator 3 comprises resisters 11 and 12, an operational amplifier 13, first and second comparators 14 and 15, RS flip-flop 16, etc. In the variable hysteresis comparator 3, a hysteresis width control signal 103, i.e. the output signal 103 of the peak detector 2, is divided by means of a voltage divider formed by the resisters 11 and 12 to produce a hysteresis width determining signal 105; and the hysteresis width determining signal 105 is supplied to inverted input terminals of the first and second comparators 14 and 15, respectively. To a non-inverting input terminal of the first comparator 14, is supplied the tracking error signal 101; and to a non-inverting input terminal of the second comparator 15, is supplied an inverted tracking error signal obtained by inverting the tracking error signal 101 by means of the operational amplifier 13. In the first comparator 14, when the tracking error signal 101 exceeds the hysteresis width determining signal 105, an output signal 107 of the comparator 14 is supplied to a set terminal S of the flip-flop 16 to make the flip-flop 16 in a set condition; while in the second comparator 15, when the inverted tracking error signal 106 exceeds the hysteresis width determining signal 105, an output signal 108 of the comparator 15 is supplied to a reset terminal R of the flip-flop 16 to make the flip-flop 16 in a reset condition. In the flip-flop 16, a bivalent signal 109 corresponding to the tracking error signal 101 is produced in accordance with said output signals 107 and 108 of the first and second comparators 14 and 15.

Figure 6A:
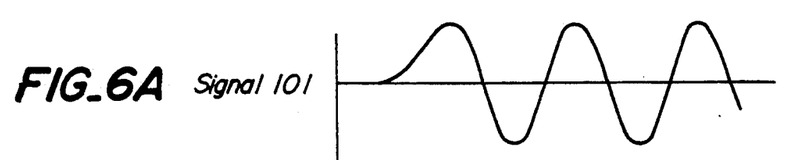
FIGS. 6A to 6G are waveforms showing signals supplied to and generated in the first embodiment of the bivalent signal generating circuit illustrated in FIG. 4.
Figure 6B:
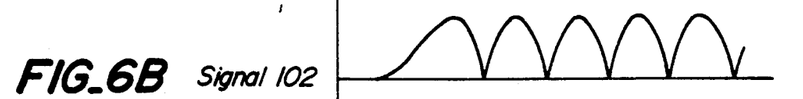
Figures 6C, 6D:
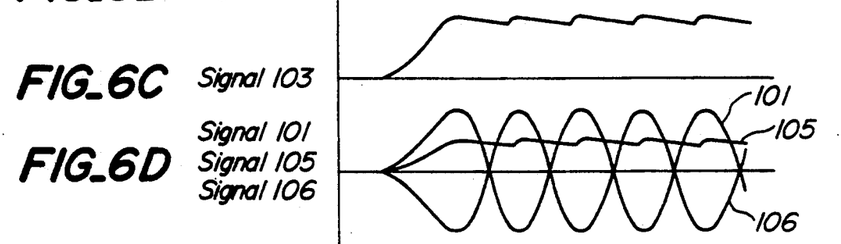
Figure 6E:
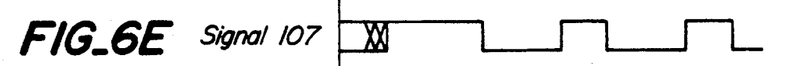
Figure 6F:
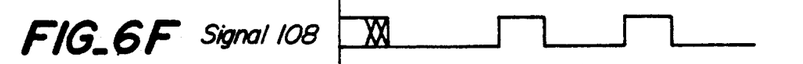
Figure 6G:
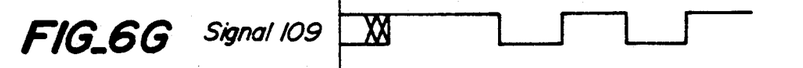

FIGS. 6A to 6G illustrate waveforms of signals produced in the bivalent signal generating circuit according to the first embodiment of the invention. FIG. 6A shows a waveform of the tracking signal 101; and FIG. 6B a waveform of the absolute-value signal 102 produced in the absolute-value detecting circuit 1. A peak of the absolute-value detected signal 102 is detected by the peak detector 2 to produce the peak detected signal 103. The peak detection voltage signal 103 is divided by means of the resisters 11 and 12, that is to say, the amplitude of the peak detection voltage signal 103 is compressed, to generate the hysteresis width determining signal 105. The hysteresis width control signal 105 is compared with the tracking error signal 101 in the first comparator 14 to produce the flip-flop set signal 107. The flip-flop set signal 107 becomes high level when the tracking error signal 101 is larger than the hysteresis width determining signal 105; and the signal 107 becomes low level when the tracking error signal 101 is smaller than the hysteresis width determining signal 105. On the other hand, the hysteresis width determining signal 105 is compared with the inverted tracking error signal 106 in the second comparator 15 to produce the flip-flop reset signal 108. The level of the flip-flop reset signal 108 becomes high when the inverted tracking error signal 106 is larger than the hysteresis width determining signal 105; and the level of the flip-flop reset signal 108 becomes low when the inverted tracking error signal 106 is smaller than the hysteresis width determining signal 105. In the flip-flop 16, an inverting reaction is conducted in accordance with raising edges of the flip-flop set signal 107 and the flip-flop reset signal 108 and the bivalent signal 109 corresponding to the tracking error signal 101 is obtained. The flip-flop 16 is maintained to be set until it is reset by the raising edge of the flip-flop reset signal 108; and then the flip-flop 16 is remained to be reset until the raising edge of the flip-flop set signal 107 is supplied to the flip-flop 16.

Here, a case that a signal level of the tracking error signal 101 is varied will be considered. When the signal level of the tracking error signal is varied because of a noise, etc., signal levels of the absolute-value signal 102 and the peak detection signal 103 are also varied, successively, in accordance with the variation of the signal level of the tracking error signal 101, and thus a signal level of the hysteresis width determining signal 103 is varied in the same manner. Therefore, when the signal level of the tracking error signal 101 is large, the signal level of the hysteresis width determining signal 105 also becomes large. Additionally, even if some chatterings are generated in the peak detected signal 103, it is possible to compare the tracking error signal 101 and the inverted tracking error signal 106 with the hysteresis width determining signal 105 in the first and second comparators 14 and 15 without being affected by the chatterings, and thus the bivalent signal can be obtained in a stable manner. On the other hand, when the signal level of the tracking error signal 101 is small, the signal level of the hysteresis width determining signal 105 also becomes small; thus there is not caused the problem mentioned in the above is not caused such that the signal level of the tracking error signal 101 becomes smaller than the hysteresis width and the proper bivalent signal cannot be obtained. As stated above, since the variable hysteresis comparator 3 has a proper hysteresis width, there would not be caused a chattering even if a noise is superimposed upon the input signal to be converted into a bivalent signal. Therefore, the number of tracks formed on the information recording medium can be correctly counted and the moving velocity of the optical pick up device can be correctly detected by the thus obtained bivalent signal.

Figure 7:
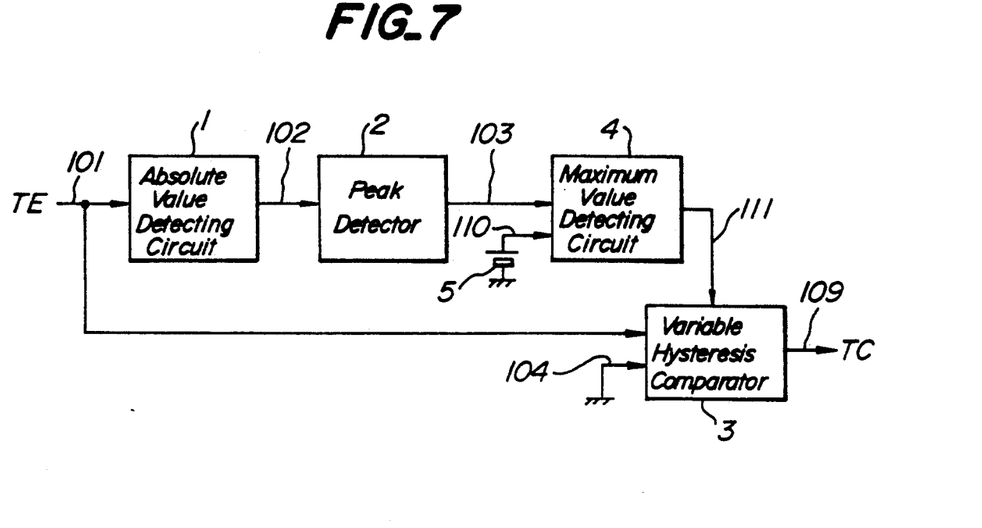
FIG. 7 is a block diagram depicting a second embodiment of the bivalent signal generating circuit according to the invention.

FIG. 7 is a block diagram illustrating a structure of the bivalent signal generating circuit of the second embodiment according to the invention. The bivalent signal generating circuit of the second embodiment comprises a maximum value detecting circuit 4 in addition to the construction elements of the bivalent signal generating circuit of the first embodiment. As shown in FIG. 7, the maximum value detecting circuit 4 is arranged between the peak detector 2 and the variable hysteresis comparator 3. In the maximum value detecting circuit 4, there are supplied the peak detected signal 103 of the peak detector 2 and a signal 110 supplied from a voltage supply source 5 and a larger one of the peak detected signal 103 and the signal 110 having a given voltage is selected to produce a maximum value detection signal 111. The maximum value detection signal 111 is supplied to the variable hysteresis comparator 3 to control the hysteresis width thereof.

Figure 8:
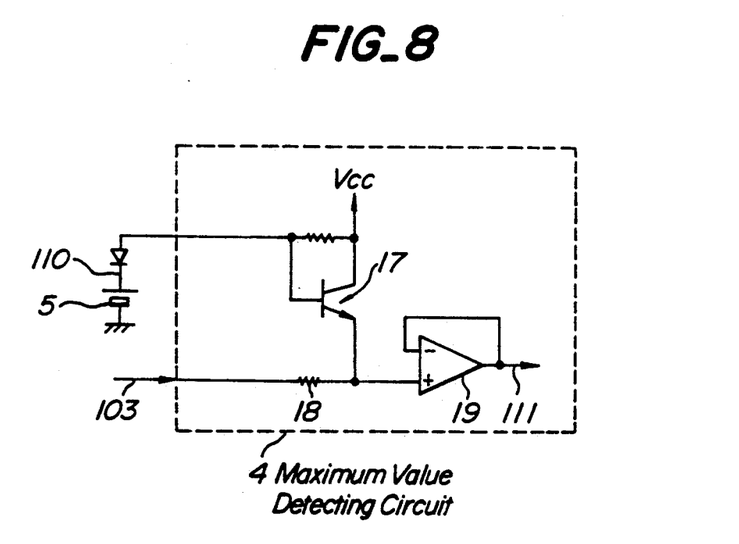
FIG. 8 is a circuit diagram illustrating a maximum value circuit used in the second embodiment of the bivalent signal generating circuit depicted in FIG. 7.
Figure 9A:
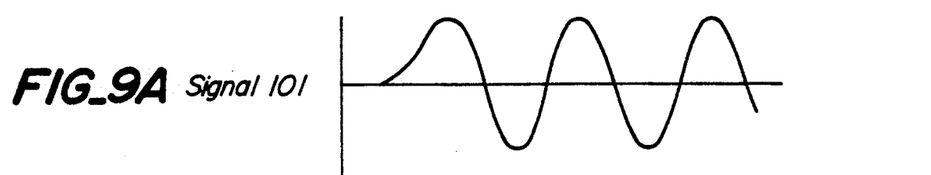
FIGS. 9A to 9G are waveform representing signals supplied to and generated in the bivalent signal generating circuit according to the second embodiment depicted in FIG. 7.
Figure 9B:
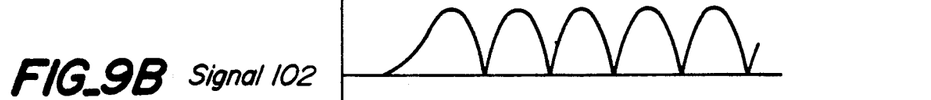
Figure 9C:
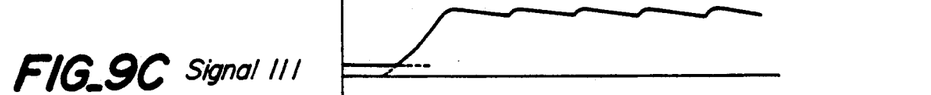
Figures 9D, 9E:
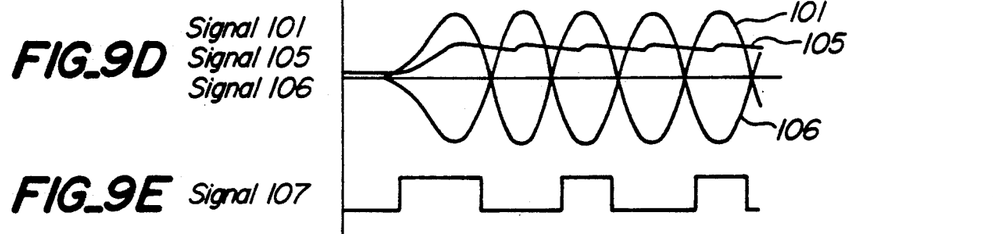
Figure 9F:
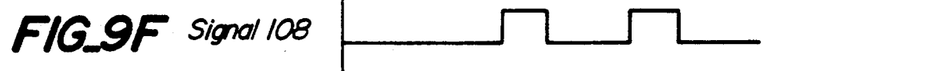
Figure 9G:
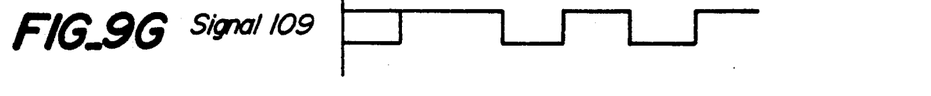

FIG. 8 is a circuit diagram representing a structure of the maximum value detecting circuit 4, which comprises a transistor 17, a resister 18, an operational amplifier 19, etc. In this circuit 4, when the peak detected signal 103 supplied from the peak detector 2 becomes smaller than the voltage signal 110 given by the voltage supply source 5, the transistor 17 is turned on; and an electric current is supplied to the resister 18 via a collector-emitter of the transistor 17 to keep an electric potential of the emitter at the given voltage. Then, in the operational amplifier 19, there is generated the maximum value detection signal 111 having a low impedance on the basis of the electric potential of the emitter. The maximum value detection signal 111 is supplied to the variable hysteresis comparator 3 as the hysteresis width control signal.

While, first embodiment explained in the above, at an initial state when it is started to generate the tracking error signal 101, the hysteresis width of the variable hysteresis comparator 3 is zero. Therefore, if a chattering is caused by a noise at the initial state, the bivalent signal would also have a chattering. Thus, in the first embodiment, there is a problem such that a miscounting is apt to be caused at the initial state. Generally, peripheral circuits of the bivalent signal generating circuit is constructed such that the variation of the bivalent signal supplied from the variable hysteresis comparator 3 at the initial state is inhibited in counting operation. However, in this case, in case a variation of the moving velocity of the light spot illuminated on the information recording medium, by which the tracking error signal is determined, is not constant, it is necessary to vary a term over which the variation of the bivalent signal should be inhibited in accordance with the moving velocity of the light spot. As a result, the peripheral circuit of the bivalent signal generating circuit becomes complex in structure. Additionally, when the hysteresis width is zero, there would be apt to be caused such problem that the bivalent signal is fed back to the input side of the bivalent signal generating circuit by a stray of the circuit to cause undesired oscillation.

In the second embodiment, in order to determine a lower limit of the hysteresis width of the variable hysteresis comparator 3, there are provided the maximum value detecting circuit 4 and the voltage supply 5 for supplying a given voltage to the maximum value detecting circuit 4. Therefore, in the second embodiment, it is possible to prevent the chattering of the bivalent signal caused at the initial state. That is to say, as shown in FIG. 9, the maximum value detected signal 111 supplied from the maximum value detecting circuit 4 does not become zero at the initial state of the tracking error signal 101, so that the hysteresis width determining signal 105 also does not become zero and thus there is not caused any chattering in the bivalent signal 109. In this case, at the initial state when the tracking error signal is started to be generated, the bivalent signal 109 is kept at a state (in a high level state or a low level state) just before the tracking error signal is started to be generated. However, it is possible to correctly count the number of the tracks by counting the trailing edges of the bivalent signal shown in FIG. 9G.

Figure 10:
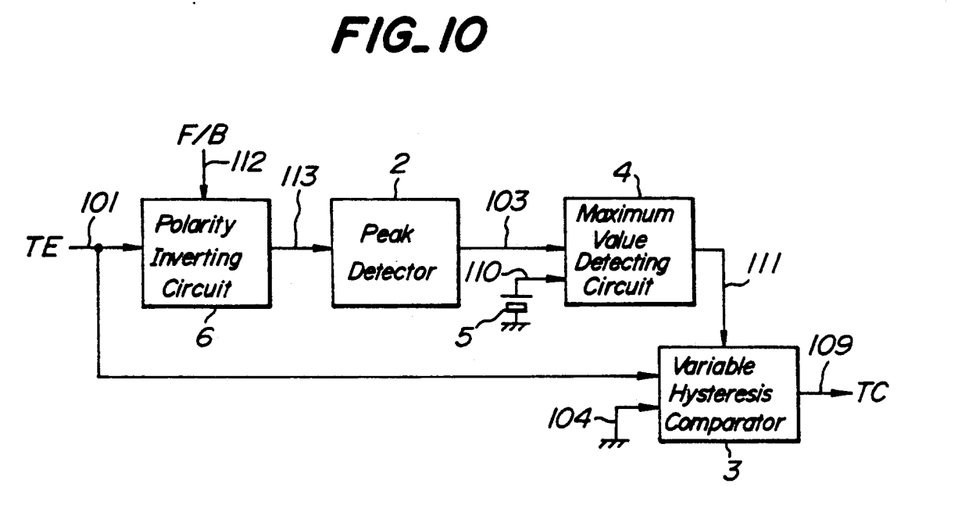
FIG. 10 is a block diagram showing a third embodiment of the bivalent signal generating circuit according to the invention.
Figure 11:
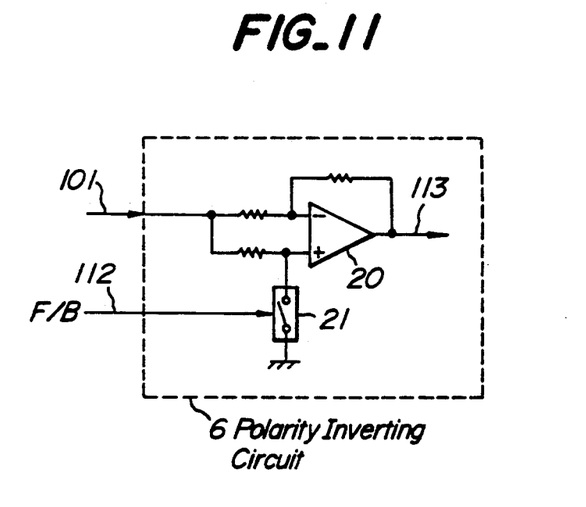
FIG. 11 is a circuit diagram depicting a structure of a polarity inverting circuit used in the third embodiment of the bivalent signal generating circuit shown in FIG. 10.
Figure 12A:
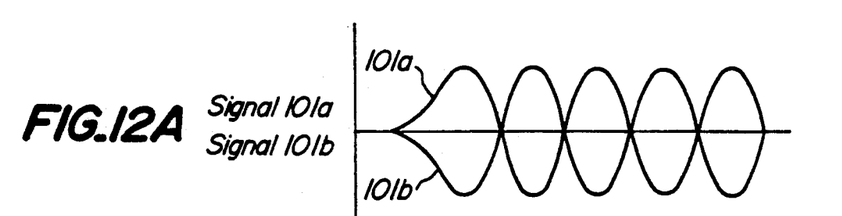
FIGS. 12A to 12F are signal waveforms illustrating signals supplied to and generated in the bivalent signal generating circuit according to the third embodiment shown in FIG. 10.
Figure 12B:
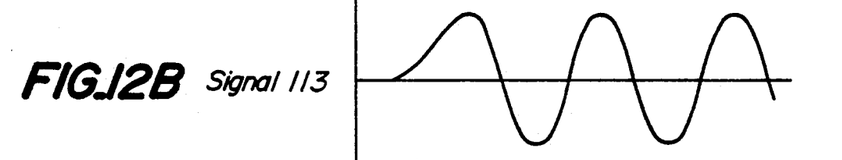
Figure 12C:
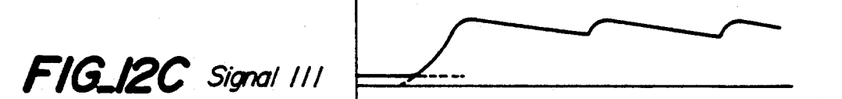
Figure 12D:
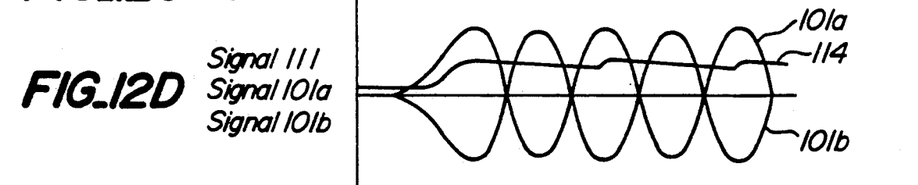
Figure 12E:
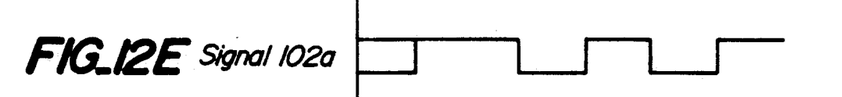
Figure 12F:
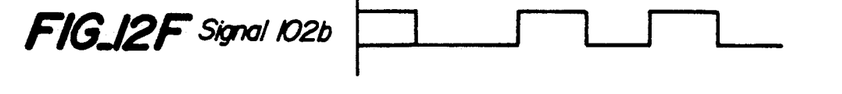

FIG. 10 is a block diagram of the third embodiment of the bivalent signal generating circuit according to the invention. The bivalent signal generating circuit of the third embodiment comprises a polarity inverting circuit 6 instead of the absolute-value detecting circuit 1 of the second embodiment. In the polarity inverting circuit 6, a polarity of the input signal 101 is inverted in accordance with a polarity switching signal 112. It should be noted that it may be possible to apply the polarity inverting circuit 6 instead of the absolute value circuit 1 of the first embodiment, in which the maximum value detecting circuit 4 and the voltage supply 5 are not provided. FIG. 11 is a circuit diagram showing a structure of the polarity inverting circuit 6. In the polarity inverting circuit 6, there are provided an operational amplifier 20, a switch 21, etc. The tracking error signal 101 has a directional property. In other words, there are forwardly tracking error signal and backward tracking error signal. Therefore, the absolute value detecting circuit 1 is provided in the first and second embodiments in order to produce a bivalent signal in a proper manner even when the light spot illuminated on the information recording medium is moved in either forward (outward) and backward (inward) directions. In the third embodiment, the polarity inverting circuit is used for the absolute-value detection circuit in order to compensate for the directional property of the tracking error signal in a cheep manner.

The tracking error signal generated when the light spot moves in the forward direction has a phase which is deviated from that of the tracking error signal generated when the light spot is moved in the backward direction by 180 degrees. In FIG. 12, the waveform 101a represents the forward tracking error signal and the waveform 101b represents the backward tracking error signal. If generating a bivalent signal corresponding to the backward tracking error signal, it is not possible to make the bivalent signal properly at the first half period because the hysteresis level does not increase. Therefore, in this embodiment, it is arranged that the polarity of the backward tracking error signal 101b is inverted in order to obtain a signal having the same phase as that of the forward tracking error signal 101a. More detailed explanation will be given. As shown in FIG. 11, when the forward tracking error signal 101 is supplied to the polarity inverting circuit 6, the switch 21 is opened in accordance with the polarity switching signal 112. Then, the tracking signal 101 is not inverted. On the other hand, when the backward tracking error signal 101b is supplied to the circuit 6, the switch 21 is closed in accordance with the polarity switching signal 112 to invert the polarity of the backward tracking error signal 101b and the inverted tracking error signal 101b is outputted from the amplifier 20. The output signal 113 of the polarity inverting circuit 6 is supplied to the peak detector 2 to produce a peak detected signal 103; and then to the maximum value detecting circuit 4 there are supplied the peak detection signal 103 and the voltage signal 105 having a given voltage to produce the hysteresis width control signal 111. In the maximum value detecting circuit 4, the lower limit of the peak detected signal 103 is limited by the voltage supplied from the voltage supply 105 and thus the hysteresis width control signal 111 is supplied to the variable hysteresis comparator 3. It should be noted that the waveform 102a represents the bivalent signal corresponding to the forward tracking error signal 101a, and the waveform 102b represents the bivalent signal corresponding to the backward tracking error signal 101b.

As stated in the above, in accordance with the third embodiment, it is possible to obtain almost the same characteristic of the bivalent signal without an expensive cost.

The present invention is not limited to the above mentioned embodiments, but many alternatives and variations can be applied thereto. For instance, in the above mentioned embodiments, the bivalent signal generating circuit is explained by taking the case of tracking error signal, but the bivalent signal generating circuit according to the invention can be applied to the other signals such as an envelope detecting signal of the information reading out signal of the optical disc, a light intensity signal of the light beam reflected from the optical disc, a tracking error signal of the capacitance disc, an envelope detecting signal of the reading out signal of the helical scanning type magnet tape, etc.

As explained above, according to the invention, when the input signal having a substantially sinusoidal waveform such as the tracking error signal is converted to the bivalent signal, the hysteresis width of the comparing means for comparing the input signal with a predetermined value is varied in accordance with the amplitude of the input signal. Therefore, even if the amplitude of the input signal is varied or a noise is superimposed upon the input signal, it is possible to obtain the bivalent signal corresponding to the input signal in a stable manner without causing a chattering.

What is claimed is:

1. A bivalent signal generating circuit comprising:
   hysteresis width controlling means for receiving an input signal having a substantially sinusoidal waveform to produce a hysteresis width controlling signal whose signal level is changed in accordance with a signal level of the input signal; and
   comparing means for setting a variable hysteresis width in accordance with said hysteresis width controlling signal and comparing the input signal with a threshold level determined by the hysteresis width to generate a bivalent signal corresponding to the input signal, wherein:
   said hysteresis width controlling means comprises an absolute value detecting circuit for detecting an absolute value of the input signal, and a peak detecting circuit for detecting a peak value of the absolute value of the input signal as the hysteresis width controlling signal.

2. A bivalent signal generating circuit according to claim 1, wherein:
   said hysteresis width controlling means further comprises a maximum value detecting circuit for producing a hysteresis width controlling signal having a predetermined level when the peak value of the input signal is lower than a predetermined threshold value.

3. A bivalent signal generating circuit according to claim 1, wherein:
   said comparing means comprises an input terminal for receiving the input signal, a control signal input terminal for receiving the hysteresis width controlling signal, a first comparator having a first input terminal connected to said input terminal and a second input terminal, an operational amplifier for inverting the input signal, a second comparator having a first input terminal connected to an output of the operational amplifier and a second input terminal connected to the second input terminal of the first comparator, a voltage divider connected to the control signal input terminal, a divided hysteresis width controlling signal from said voltage divider being applied to the second input terminals of the first comparator and the second comparator, a set-reset flip-flop having a set input terminal connected to an output of the first comparator and a reset input terminal connected to an output of the second comparator, and an output terminal connected to an output of the set-reset flip-flop.

4. A bivalent signal generating circuit comprising:
   hysteresis width controlling means for receiving an input signal having a substantially sinusoidal waveform to produce a hysteresis width controlling signal whose signal level is changed in accordance with a signal level of the input signal; and
   comparing means for setting a variable hysteresis width in accordance with said hysteresis width controlling signal and comparing the input signal with a threshold level determined by the hysteresis width to generate a bivalent signal corresponding to the input signal, wherein:

said hysteresis width controlling means comprises a polarity inverting circuit for inverting the polarity of the input signal in accordance with the phase of the input signal, a peak detecting circuit for detecting a peak value of an output signal of the polarity inverting circuit, and a maximum value detecting circuit for producing a hysteresis width controlling signal having a predetermined level when the input signal is lower than a predetermined threshold value.

5. A bivalent signal generating circuit according to claim 4, wherein:

said comparing means comprises an input terminal for receiving the input signal, a control signal input terminal for receiving the hysteresis width controlling signal, a first comparator having a first input terminal connected to said input terminal and a second input terminal, an operational amplifier for inverting the input signal, a second comparator having a first input terminal connected to an output of the operational amplifier and a second input terminal connected to the second input terminal of the first comparator, a voltage divider connected to the control signal input terminal, a divided hysteresis width controlling signal from said voltage divider being applied to the second input terminals of the first and second comparators, a set-reset flip-flop having a set input terminal connected to an output of the first comparator and a reset input terminal connected to an output of the second comparator, and an output terminal connected to an output of the set-reset flip-flop.

6. A bivalent signal generating circuit according to claim 2, wherein:

said comparing means comprises an input terminal for receiving the input signal, a control signal input terminal for receiving the hysteresis width controlling signal, a first comparator having a first input terminal connected to said input terminal and a second input terminal, an operational amplifier for inverting the input signal, a second comparator having a first input terminal connected to an output of the operational amplifier and a second input terminal connected to the second input terminal of the first comparator, a voltage divider connected to the control signal input terminal, a divided hysteresis width controlling signal from said voltage divider being applied to the second input terminals of the first comparator and the second comparator, a set-reset flip-flop having a set input terminal connected to an output of the first comparator and a reset input terminal connected to an output of the second comparator, and an output terminal connected to an output of the set-reset flip-flop.

* * * * *